United States Patent [19]
Tani

[11] Patent Number: 5,307,011
[45] Date of Patent: Apr. 26, 1994

[54] LOADER AND UNLOADER FOR TEST HANDLER

[75] Inventor: Mitsuaki Tani, Saitama, Japan

[73] Assignee: Advantest Corporation, Tokyo, Japan

[21] Appl. No.: 803,154

[22] Filed: Dec. 4, 1991

[51] Int. Cl.$^5$ .................. G01R 31/02; B07C 5/344
[52] U.S. Cl. ........................ 324/158 F; 209/573; 209/651
[58] Field of Search ............ 324/158 F; 209/573, 209/651, 909, 914, 917; 414/222, 224, 225

[56] References Cited

U.S. PATENT DOCUMENTS

| | | | |
|---|---|---|---|
| 3,664,499 | 5/1972 | Sahakian | 209/573 |
| 4,234,418 | 11/1980 | Boissicat | 209/573 |
| 4,423,815 | 1/1984 | Boissicat | 209/655 |
| 4,715,501 | 12/1987 | Sato et al. | 209/573 |
| 4,760,924 | 8/1988 | Sato et al. | 209/573 |
| 4,908,126 | 3/1990 | Willberg et al. | 209/573 |
| 4,926,118 | 5/1990 | O'Connor et al. | 324/158 F |
| 5,150,797 | 9/1992 | Shibata | 324/158 F |

Primary Examiner—Ernest R. Karlsen
Attorney, Agent, or Firm—Knobbe, Martens, Olson & Bear

[57] ABSTRACT

A loader and unloader is disclosed which is utilized in conjunction with an automatic test machine for handling electric devices such as integrated circuits ("ICs"), semiconductor chips, and the like. The loader handles trays containing a number of ICs to be tested and transfers them to a location on the handler where the ICs can be accurately and quickly removed from the trays for testing. Following the testing, the unloader of the present invention handles the trays which receive the ICs in accordance with various sort categories depending upon the test results. The present invention also encompasses a dual receptacle transfer arm which shuttles IC trays between and among the various components of the loader and unloader. These components are configured so as to minimize travel distance and handling time, thereby increasing the productivity of an automatic test handler into which the present loader and unloader may be incorporated.

22 Claims, 13 Drawing Sheets

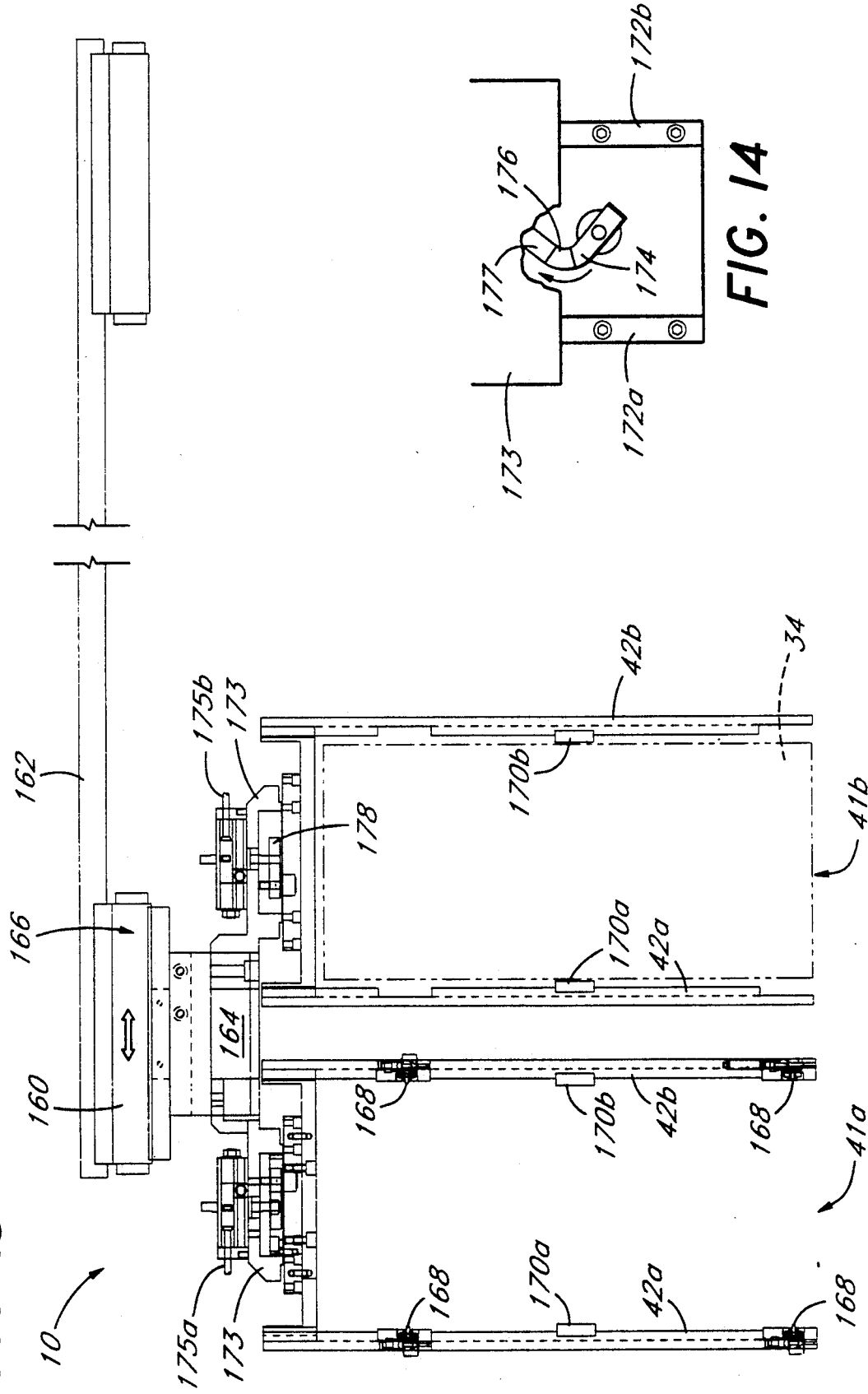

LOADER AND UNLOADER FOR TEST HANDLER

FIELD OF THE INVENTION

This invention relates to a loader and unloader for an automatic test handler of electric devices such as integrated circuits ("ICs"), semiconductor chips, and the like, and, more particularly, to a test handler having various mechanical devices which are used to quickly and efficiently transfer trays containing such ICs from one location to another within the handler.

BACKGROUND OF THE INVENTION

In the electronics industry, there is a constant demand for electronic devices, such as integrated circuits or semiconductor chips, to be produced less expensively and in smaller dimensions. One way to increase productivity of such electronic devices, and thereby reduce their unit cost, is to increase the test speed of the devices by testing a plurality of them at the same time.

It has become a test technology standard to place a number of electronic devices to be tested on a test tray and position them so as to be engaged by a test head plate having a number of corresponding test contactors. One device is placed on a seat of a carrier module, and each carrier module is provided with one or more device seats. A number of modules are then positioned by column and row on a test tray. The test tray, having a number of such carrier modules, is arranged so as to be in vertical alignment (either above or below) with a test fixture.

The test fixture includes test contactors (test pins) for contact with the pins of each device to be tested for supplying and receiving the test signals from the device. Each module is aligned with a corresponding test contactor so that when either the test tray or the test fixture are moved in a vertical direction toward the other, the contactor engages the electronic device positioned within the carrier module.

The contactor is provided with a number of test pins or leads which come into electrical communication with the leads of the electronic devices to be tested. The automatic test handler is electrically connected to a electronic device test system, for example, an IC tester which includes a test signal generator for supplying a test signal to the device, and with a signal comparator for analyzing the results of the test. Based on such results, the electronic devices are transferred to another location in the test process and sorted for proper handling.

In test handling equipment of the prior art, a number of disadvantages have become apparent. First, even with such automatic handling equipment, there is a need for extensive handling of individual ICs or chips. For example, there is a need to remove the electronic devices to be tested from a container and to place the devices in an appropriate position on the test tray prior to testing. It is also necessary, following the test, to remove the tested devices from the test tray, to sort them based on the test results, and to replace the devices into their original containers for return shipping to the customer or other appropriate destination.

Because of recent demands in the electronics industry, various new types of IC packaging have been developed. Furthermore, containers for such new IC packages have also been developed and are changing in configuration from time to time. An example of such a container is referred to as a "customer tray," wherein a number of IC devices are aligned in a horizontal plane in a manner similar to the test tray, as described above. However, customer trays have not been standardized, and the size, shape, capacity and spacing between the seats of the devices vary widely from manufacturer to manufacturer. The spacing in the customer tray may also be different from that required for the test tray. This is particularly true since the test tray requires more accuracy for securing the perfect contact between the test contactor and the IC device leads. Although the customer trays themselves have not been standardized, the industry has standardized the containers, referred to as "cassettes" or "magazines," in which the customer trays are housed for storage and shipping.

The customer trays interact with previous handlers in two basic ways. First, customer trays full of untested ICs must be removed from their respective magazines and placed in a position so that the ICs are accessible for transfer to a test tray and subsequent testing. This phase of the IC handling is typically referred to as "loading." Secondly, empty customer trays must be placed in position with respect to the handler to receive tested and sorted ICs according to various test categories. Further, each customer tray must be returned to an appropriate magazine, again according to the tests categories. This phase of the operation is typically referred to as "unloading."

The mechanical devices of a test handler which accomplish loading and unloading are very important to the efficient operation of the handler. If delays are experienced in either facet, the throughput and thus the productivity of the handler will be decreased. In particular, the unload phase is likely to result in delays because of a need to sort the tested ICs. In the load phase, all of the ICs are treated alike, and the mechanical movements for transferring them to a test tray can be minimized, thus minimizing the time incurred. On the other hand, the sorting of tested ICs is more complicated and requires additional mechanical movement, thus incurring increased handling time.

Accordingly, there is a serious need in the integrated circuit industry for an automatic test handler which can overcome the problems and disadvantages described above in connection with loading and unloading of customer trays.

SUMMARY OF THE INVENTION

The present invention satisfies the need of IC test handlers of the prior art by providing loader and unloader apparatus which accommodate the differences in customer tray configurations while still handling the trays in a quick and efficient manner. The loader and unloader of the present invention is greatly assisted by a unique transfer arm which advantageously services both the loader and unloader. The movement of the various components of the loader and unloader, as well as the transfer arm, are minimized in order to reduce handling time. Furthermore, the movements are efficiently controlled such that two or more functions can be accomplished on each trip whenever possible.

The loader of the present invention comprises a catcher device, a load buffer, and dual load stages. Each of these components can accommodate customer trays of varying configurations and quickly transfer them from one location to another. The catcher serves to receive full customer trays from a tray magazine and transfer them to the load buffer. The load buffer in turn transfers the full customer tray to a position adjacent the load stages, just prior to the removal of the ICs from the customer tray for testing. Both the catcher and the load buffer are able to move in up and down directions as well as translate laterally. Each of the load stages, on the other hand, move only in up and down directions.

The unloader of the present invention comprises two pair of unload stages constructed in a manner identical to the load stages described above. In addition, the unloader comprises an unload buffer which positions an empty customer tray adjacent the unloader so as to be available for sorting.

The transfer of full customer trays from the load buffer to the load stages is accomplished by the transfer arm which is provided with a pair of customer tray receptacles. Thus, the transfer arm can often accomplish two functions during one trip, as explained below in more detail. The transfer arm also efficiently transfers customer trays between the unload stages and the unload buffer, as well as from the unload stages to the magazine stations and back again. Thus, the sorting process which is critical to the efficient operation of the unloader of the present invention is expedited.

The present invention also encompasses an efficient arrangement of these various components so that they can interact with one another with minimal movement, particularly that of the transfer arm. Thus, the vertical movement of the various load and unload stages is carefully coordinated with that of the twin receptacles of the transfer arm in order to accomplish the functions of loading and unloading without undue delay.

In summary, the loader and unloader of the present invention, as assisted by the transfer arm, presents a substantial advantage to IC test handlers.

BRIEF DESCRIPTION OF THE DRAWINGS

FIG. 13 is a top plan view of the transfer arm and guide rail.

FIG. 14 is a detailed front view of the rod and cam mechanism of the transfer arm;

DETAILED DESCRIPTION OF THE INVENTION

Before describing the loader and unloader of the present invention in detail, it is helpful to have a general understanding of an automatic IC test handler into which such loader and unloader may be incorporated. However, it will be understood that the principles of the present invention relating to an automatic loader and unloader are not limited to the particular test handler described herein, but can be applied with equal success to test handlers of varying configurations utilizing different test sequences.

General Description of the Handler

Figures 1, 1A:
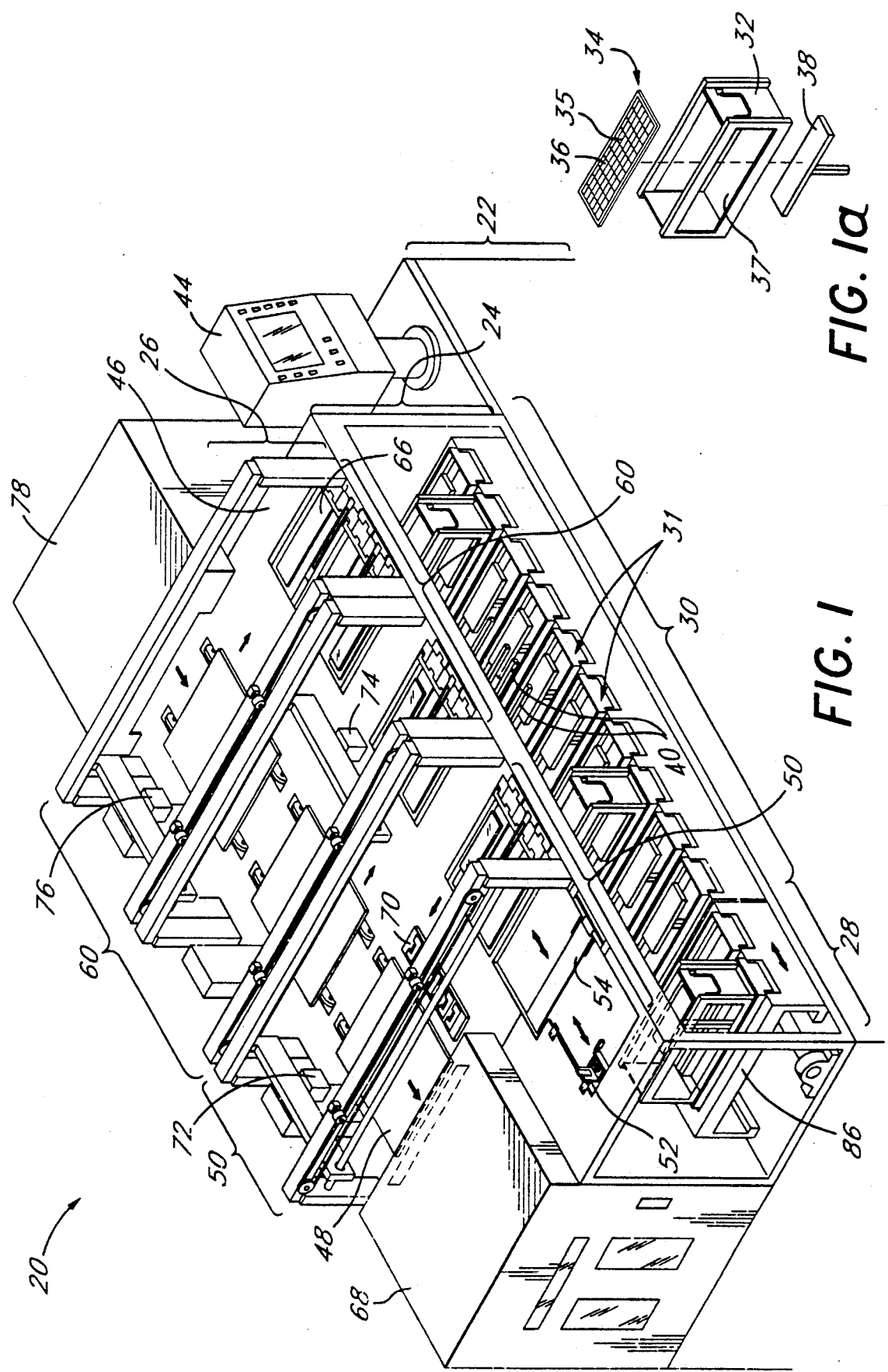
FIG. 1 is a perspective view of an automatic test handler incorporating a loader and unloader of the present invention.
FIG. 1A is an exploded view of a customer tray, its associated customer tray magazine, and a tray elevator.
Figure 2:
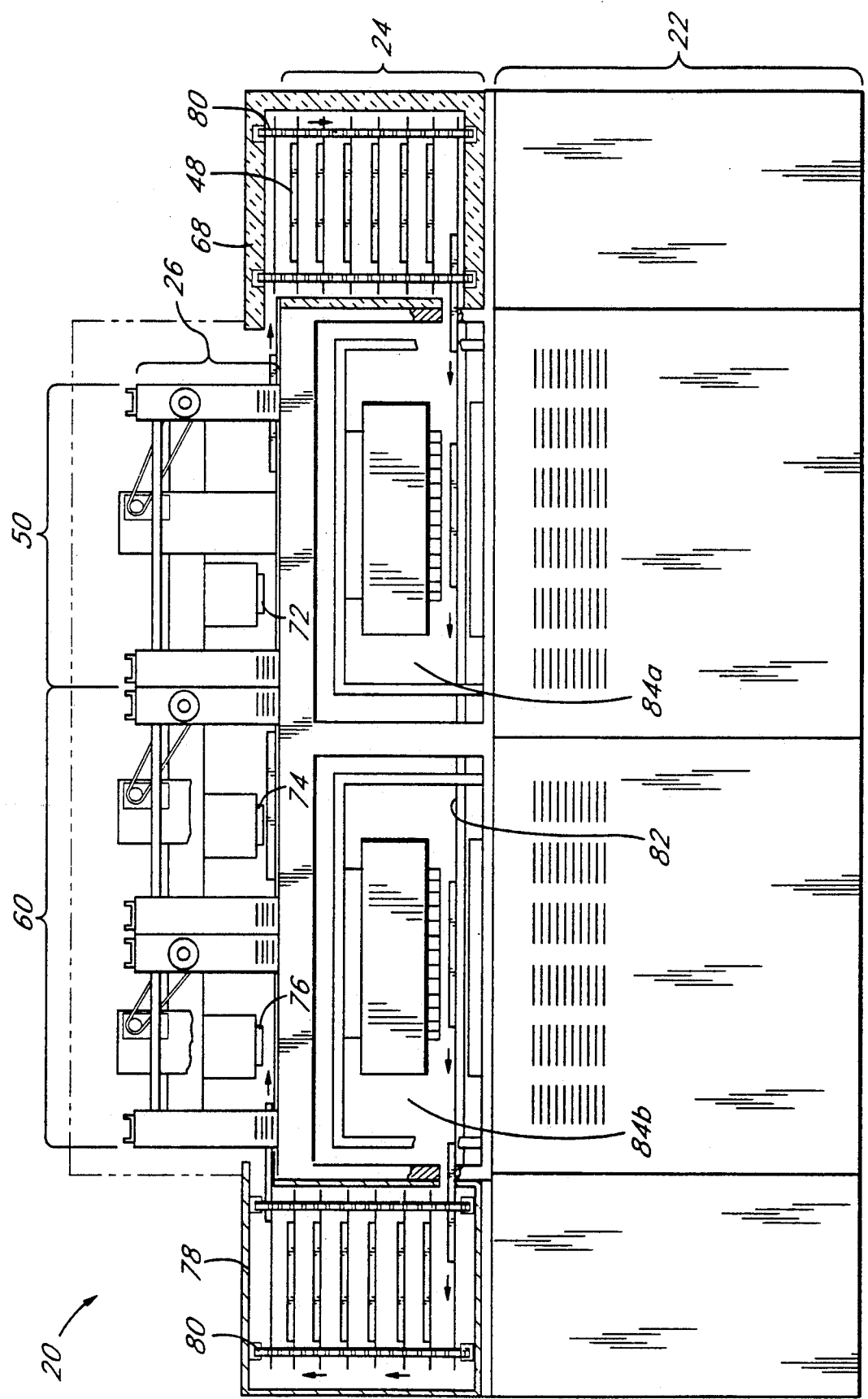
FIG. 2 is a rear elevational view of an automatic test handler into which the loader and unloader of the present invention may be incorporated.

Referring first to FIGS. 1 and 2, the principal components of a test handler into which the present loader and unloader may be incorporated is described as follows:

The handler 20 is comprised of a lower cabinet 22, a middle portion 24 and an upper portion 26. It will be noted that the lower cabinet 22 is only partially shown in FIGURE 1, but completely illustrated in the rear view of FIG. 2. The lower cabinet 22 contains power supply components, electric connections and cables (not shown) which control the function and sequence of the testing operation which occurs primarily in the middle and upper portions 24, 26 of the handler 20.

Referring primarily to FIG. 1, beginning at the front left side of the middle portion 24, there is shown the magazine input area 28 which lies immediately adjacent the magazine output area 30 which encompasses the central and right-hand portions of the front of the middle portion 24 of the handler. These magazine input and output areas comprise a number of stations 31 which receive cassettes or magazines 32 containing a plurality of stacked customer trays 34 having arrayed thereon the ICs 36 to be tested by the handler 20. Such a customer tray magazine 32 and customer tray 34 is shown in the exploded view of FIG. 1a, and will be described in more detail below. For ease of description and illustration, FIG. 1 illustrates only a single customer tray magazine 32 located in the magazine input area 28; however, it will be understood that the various stations of the magazine input and output areas 28 and 30 are each suitable for receiving a similar magazine 32.

Each of the stations 31 of the magazine output area 30 is provided with a customer tray elevator 38 for lifting the customer trays 34 stored within each magazine 32 at the appropriate time. The magazine input area 28 is provided with only a single elevator 38. The two magazines 32 received by the magazine input area 28 contain customer trays 34 having ICs 36 to be tested. The magazine 32 located at each station 31 of the magazine output area 30 receives customer trays 34 of ICs 36 which have already been tested and sorted according to the test results. Thus, in the example shown in FIG. 1, a total of ten stations 31 in the output area 30 are shown. This number of stations would provide, for example, testing of the ICs in accordance with eight different categories, while leaving one station for retest and one station for empty customer trays. However, a wide variety of customer tray input and output configurations are possible in accordance with the principles of the present invention.

Figure 4:
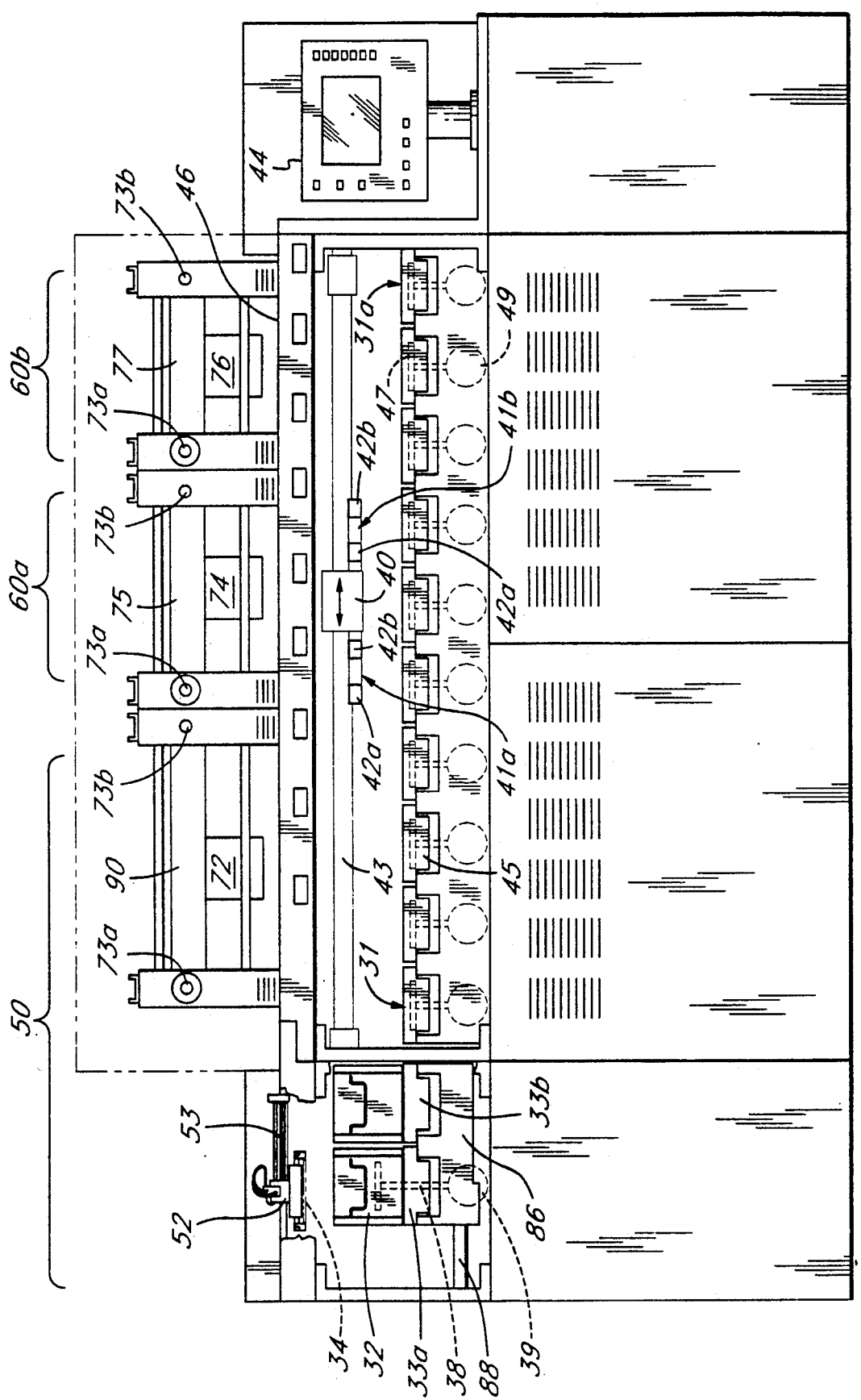
FIG. 4 is a front elevational view of the handler.

Referring again to the middle portion 24 of the handler 20 shown in FIGS. 1 and 4, a transfer arm 40 having two pair of tray arms 42 is illustrated in the magazine output area 30. This transfer arm 40 can move laterally as well as up and down, and interacts with the various sections of the handler 20 to perform the bulk of the customer tray transfer work associated with the handler 20. The movements of this transfer arm 40 are very intelligent and are controlled, by means of appropriate software commands from a control module, a display monitor 44 of which is shown on the right-hand side of the middle portion 24 of the handler 20.

The upper portion 26 of the handler 20 comprises primarily an upper surface 46 where the transfer of the ICs 36 from customer trays 34 to test trays 48 and then back again is accomplished. Beginning at the left side of the upper surface 46, there is shown the loader section 50 which comprises a load catcher 52, a customer tray buffer 54 and dual load stages 56a and 56b, arranged side by side on the upper surface 46. Immediately to the right of the loader section 50 is the unloader 60, which handles the sorted ICs 36 after they have undergone testing. The unloader 60 comprises two pair of side by side unloader stages, including unload stage 62a and unload stage 62b, located on the left, and unload stage 64a and unload stage 64b, located to the right side of the upper surface. At the extreme right end of the upper surface 46, there is found an empty customer tray buffer 66 whose purpose and function will be described in more detail below.

Still referring to FIG. 1, a soak chamber 68 is located at the left rear of the middle portion 24 of the handler 20 and extends slightly above the upper surface 46. The soak chamber 68 receives test trays 48 from the upper surface 46. The test tray 48 receives the ICs 36 to be tested from a precisor 70, which in turn receives them from the load stages 56a,b located in the loader section 50. The ICs 36 are transferred from the load stages 56a,b to the precisor 70 and then to the test tray 48 by means of a load pick and place 72 which translates above the upper surface 46 of the handler 20.

Immediately to the right of the load pick and place 72 is a pair of unload pick and place mechanisms, including left unload pick and place 74 and right unload pick and place 76. The unload pick and place mechanisms 74, 76 sort the ICs 36, depending upon the test results, and place them on the unload stages 62, 64 for subsequent transfer to the appropriate category magazines 32 stored in the magazine output area 30 below. The test trays 48 containing the tested ICs 36 arrive at the unload pick and place mechanisms 74, 76 from an unsoak chamber 78 located at the rear right side of the handler 20.

Referring primarily to the rear view of FIG. 2, the soak chamber 68 (now located on the right side of FIG. 2) receives test trays 48 from the upper surface 46 of the handler 20 and gradually lowers them by means of an elevator mechanism 80 to the lower surface 82 of the middle portion 24 of the handler 20. The purpose of the soak chamber 68 is to prepare the ICs 36 for testing by placing them in appropriate temperature and pressure environment. Each test tray 48 is then transferred through two test head chambers 84a,b where each IC device 36 undergoes the desired testing. The test tray 48 then enters the unsoak chamber 78 (located at the left of FIG. 2) where it is gradually elevated to the upper surface 46 of the handler 20 while being returned to ambient conditions. Upon exiting the unsoak chamber 78, each test tray 48 undergoes IC sorting by means of the two unload pick and place mechanisms 74, 76 which are shown adjacent to the load pick and place mechanism 72.

Several components of this test handler are the subject of copending and commonly owned patent applications which are hereby incorporated by reference. For example, general test reference of a test handler utilizing the present loader/unloader system is the subject of patent application entitled APPARATUS AND METHOD FOR AUTOMATIC TEST HANDLING, U.S. patent application Ser. No. 803,159, filed Dec. 4, 1991. Furthermore, the loader and unloader pick and place mechanisms are the subject of an application titled PICK and PLACE FOR TEST HANDLER U.S. patent application Ser. No. 801,875, filed Dec. 3, 1991. Moreover, each test head of the dual chamber testing mechanism is the subject of an application entitled CONTACT MECHANISM FOR AUTOMATIC TEST HANDLER, U.S. patent application Ser. No. 801,056, filed Dec. 3, 1991, now U.S. Pat. No. 5,227,717.

The test sequence of the handler can be generally described in connection with the schematic illustration of FIG. 3. For convenience and ease of description, the reference numerals used in FIG. 3 correspond structurally to similar portions of the test handler illustrated in FIGS. 1 and 2 which in turn illustrate the steps of the method generally by means of various arrow shown therein.

Figure 3:
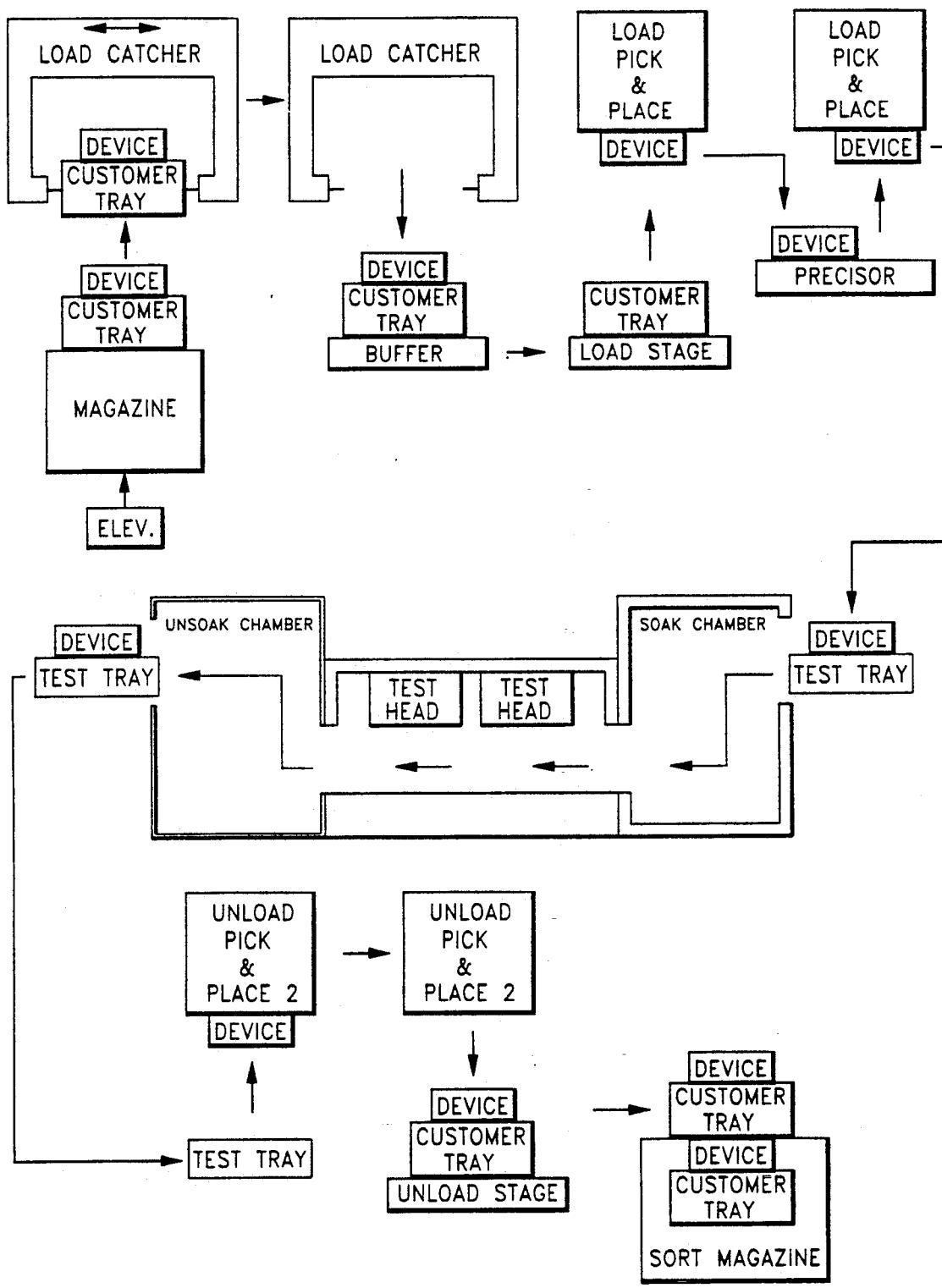
FIG. 3 is a schematic diagram illustrating the function of the loader and unloader as a part of an overall test process.

With respect to FIG. 3, for ease of description, only a single IC "device" is illustrated; although, it will be understood that multiple IC devices can be handled and tested conveniently and efficiency in accordance with the principles of the present invention. A magazine 32 containing a number of customer trays 34 having placed thereon an IC device 36 to be tested is first loaded into the magazine input area 28. The elevator 38 in the input area 28 pushes up the customer trays 34 until the uppermost customer tray 34 is elevated above the magazine 32. The catcher 52 of the load section 50 then drops down and attaches to the customer tray 34 having the IC device 36 to be tested.

The catcher 52 then transfers the customer tray 34 to the buffer 54 where it awaits its turn to be received by one of the load stages 56a,b. The transfer arm 40 shown in FIGS. 1 and 4 is used to transfer the customer tray 34 from the buffer 54 to one of the load stages 56a,b. The load pick and place 72, by means of suction, then attaches to the IC device 36 to be tested and places it in the precisor 70 which orients the device 36 precisely with respect to the handler 20 and, more particularly, with respect to the test tray 48. The load pick and place 72 then picks up the device 36 again from the precisor 70 and places it in its precise location on the test tray 48.

Subsequent to removal of all the ICs 36 to be tested by the load pick and place 72, empty customer trays are removed from the load stages 56a,b and placed in the empty magazine station 31, preferably at the far right of the magazine output area 30, or on the empty customer tray buffer 66 located at the extreme far right of the unload section 60. This movement and transfer is accomplished by the transfer arm 40.

The test tray 48 is then transferred into the soak chamber 68 where the device 36 undergoes environmental conditioning. The test tray 48 is then transferred to the dual test head chambers 84a,b where the electronic testing actually occurs. The test tray 48 is then elevated through the unsoak chamber 78 and is expelled therefrom under ambient conditions. The handler 20 then transfers the test tray 48 to a position where the right unload pick and place 76 can sort approximately one-half of the tested ICs, placing them in one of the unload stages 64a or 64b. If the IC device 36 in question is not sorted by the right unload pick and place 76 (which will depend upon the sorting hierarchy determined by the handler and explained in more detail below), the test tray 48 is then shifted to a position under the left unload pick and place 74 where all of the remaining Ic devices are sorted by the unload pick and place 74 and placed in one of the two unload stages 62a or 62b.

At each of the unload stages 62 or 64, a customer tray 34 is waiting to receive the sorted ICs in accordance with the test results and the desired sort categories. When a customer tray 34 is full or no longer needed for sorting purposes, the transfer arm 40 moves it from the unload stage 62, 64 and places it in the sort magazine 32 located below the upper surface 46 of the handler 20 in the magazine output area 30.

This process then continues with the now empty test tray 48, leaving its position under the left unload pick and place 74 and shifting to a position under the load pick and place 72 to receive more IC devices 36 to be tested.

Description of the Loader

The loader 50 of the present invention can be described in greater detail in connection with FIG. 1 and the top plan view of FIG. 5. As indicated in these views, the loader 50 is located at the left portion of the handler 20 adjacent the unloader section 60 located to the right of the loader 50. It should be noted that the stage components of the loader 50 and unloader 60 are virtually identical in construction and operation, as will be explained in more detail below.

Figure 5:
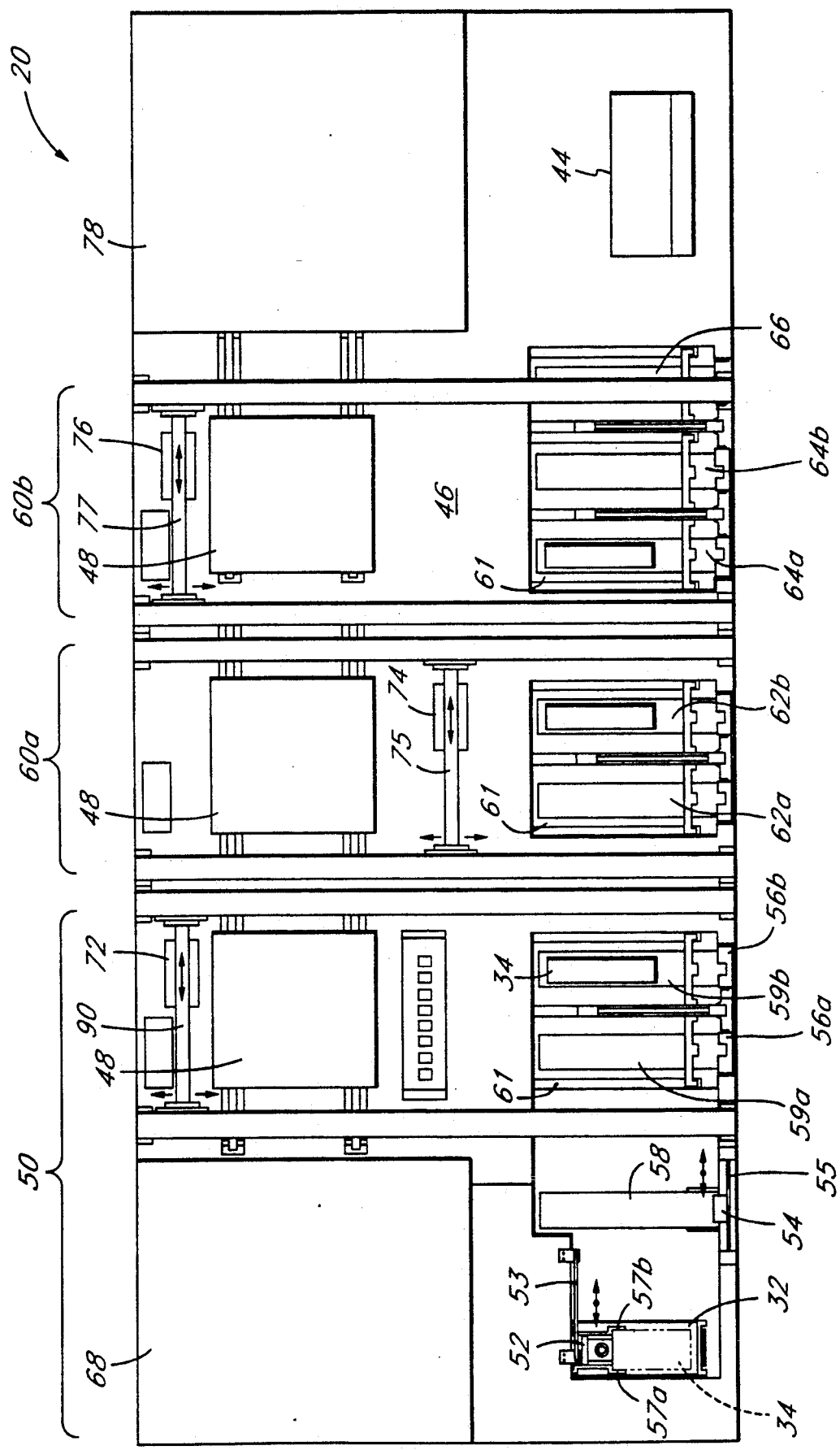
FIG. 5 is a top or plan view of the test handler illustrating the loader and unloader sections.

The loader 50 of the present invention comprises, beginning on the left in FIG. 5, a catcher 52, a buffer 54, and dual load stages 56a,b arranged in side-by-side fashion. These components are all aligned in parallel so as to be able to transfer a customer tray 34 from the magazine 32 into the position where the ICs 36 can be accessed by the load pick and place 72 and transferred to the test tray 48. As will be explained in more detail below, these components are arranged and interact with one another in order to minimize their respective movements as well as those of the transfer arm 40, thus efficiently and carefully transferring the customer tray 34 into position for IC testing.

Catcher

The catcher 52 component of the loader 50 will first be described. As shown in FIGS. 4 and 5, the catcher 52 is arranged so as to be over and in parallel with one of the customer tray magazines 32. As shown more clearly in the exploded view of FIG. 1A, the magazine elevator 38 lifts the customer trays 34 in the magazine 32 so that the upper most customer tray 34 is slightly elevated above the top surface of the magazine 32. This places the customer tray 34 in position to be received by the catcher 52 whose movements may be described as follows. The catcher 52 first goes down to receive the customer tray 34, back up to its original left hand position, translates to the right into a position above the buffer 54 (see FIG. 5) and then drops down to deposit the customer tray 34 on the buffer 54.

Figure 6:
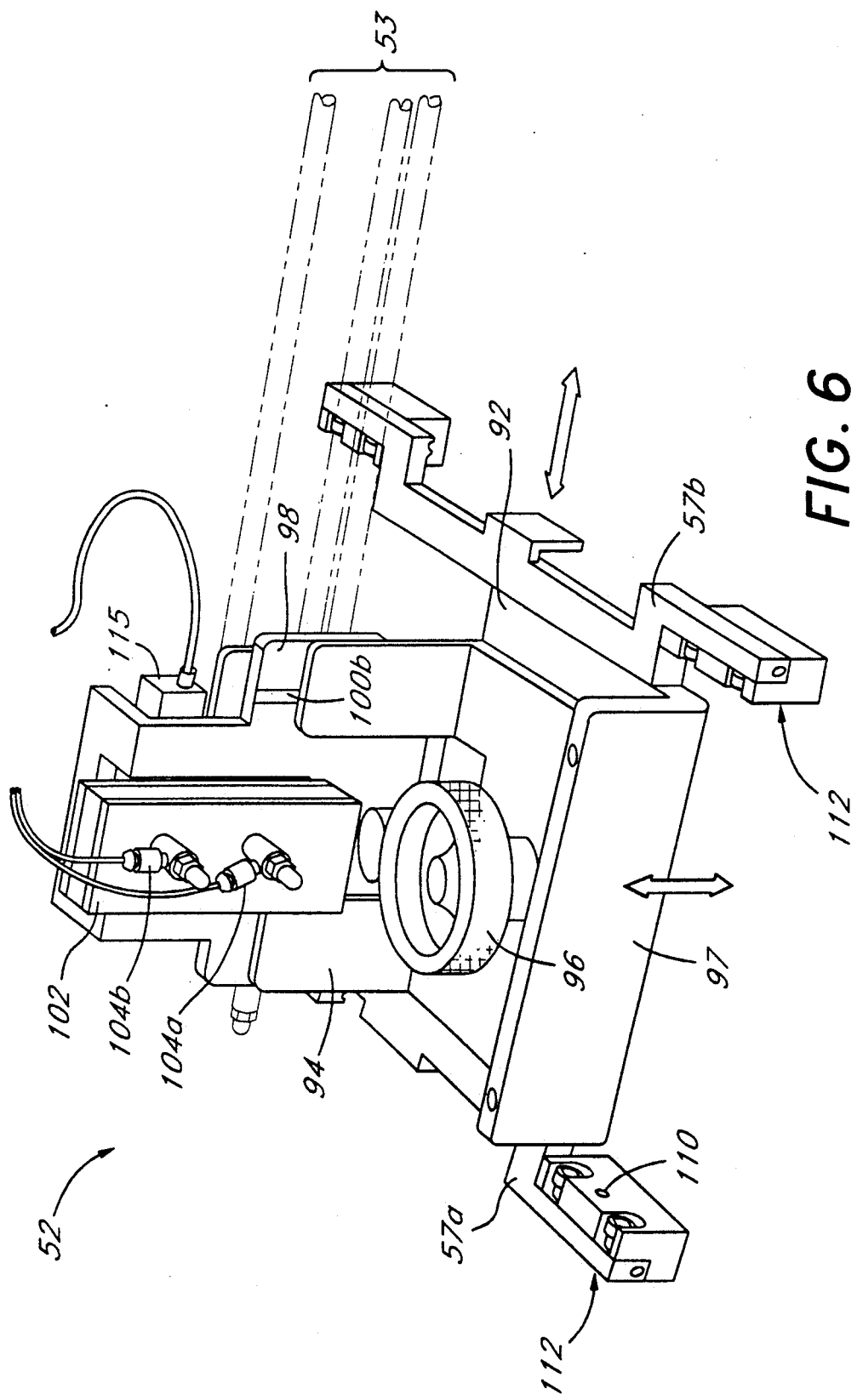
FIG. 6 is a perspective view of the catcher of the handler.
Figure 7:
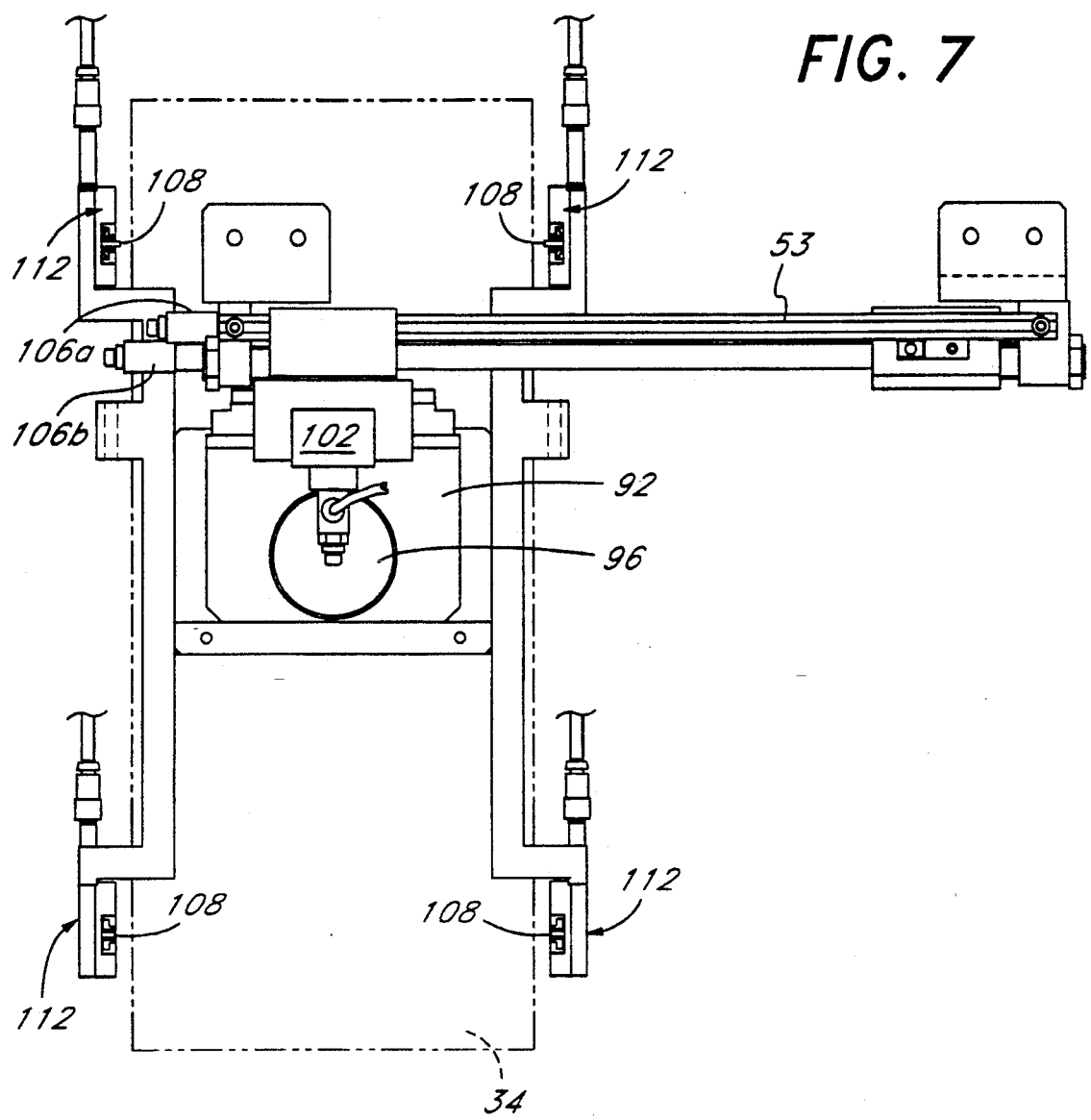
FIG. 7 is a top plan view of the catcher.

The construction and operation of the catcher 52 can be described in more detail in connection with FIGS. 6-8. FIG. 6 illustrates in a perspective view the catcher 52 which translates laterally on a series of horizontal rails 53, shown in dotted lines in FIG. 6. FIG. 7 is a top plan view of the catcher 52 shown in its left position, and FIG. 8 is a front elevational view thereof in the same position.

It should be noted that the catcher 52 can assume only two lateral positions, left and right, and will not stop at any intermediate positions.

With reference to FIGS. 6 and 7, it will be seen that the catcher 52 straddles the customer tray 34 (shown in dotted lines in FIG. 7) so as to engage the tray from the sides. The catcher 52 is comprised of two spaced parallel arms 57a,b separated and connected to one another by means of a bridge 92. This straddle design of the catcher 52 is an important advantage of the present invention as it allows the catcher 52 to securely engage the customer tray 34 in tight quarters. That is, the two customer tray input magazines 32 are arranged close together, minimizing the space available for the catcher's movements. In addition, the customer trays 34 are relatively thin and the engagement by the catcher 52 on their sides must be very accurate. The bridge 92 of the catcher 52 is connected to an L-shaped carriage 94 which is provided on its horizontal surface with a large knurled knob 96, the purpose of which will be described in more detail below. The front plate 97 of the bridge 92 should from above customer tray 34. The carriage 94 in turn is mounted on a bracket 98 having a pair of rails 100a,b (only one of which is shown in FIG. 6) on which the carriage 94 moves up and down.

Figure 8:
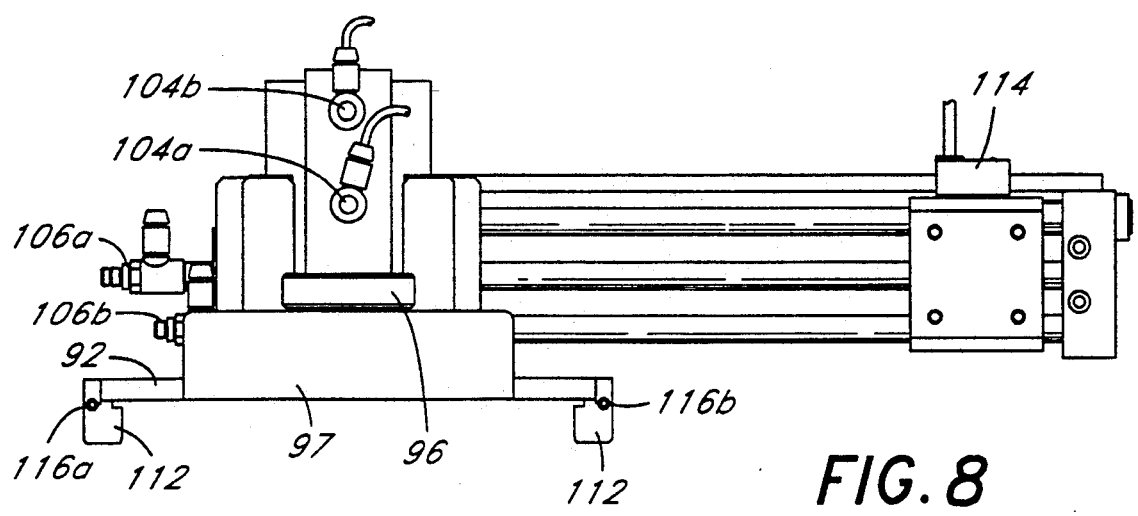
FIG. 8 is a front elevational view of the catcher.

The up and down movement of the catcher 52 is accomplished pneumatically by means of a pneumatic cylinder 102 seen best in FIGS. 6 and 8. The respective up and down movement is accomplished by a pair of pneumatic valves 104a,b shown mounted on the cylinder. Likewise, the left and right positions of the catcher 52 are controlled pneumatically by a pair of valves 106a,b located to the left of the bracket 98, as shown in FIGS. 7 and 8.

The catcher 52 engages the customer tray 34 by means of four pins 108, two of which are located on each arm and arranged across from one another, as shown in FIG. 7. The pins 108 are mounted in holes 110 which are formed in housings 112 located at each pin position on the arms 57a,b. In order to engage the customer tray 34, the pins 108 protrude from the holes 110 and engage corresponding holes (not shown) in the sides of the customer tray 34. Thus, this arrangement securely holds a customer tray 34 which must be delicately and carefully handled so as to not spill the ICs 36 arranged therein.

The pins 108 are actuated pneumatically by means of valves and supply hoses (not shown) mounted at each pin housing. It should be noted that the arms 57a,b are separated by a distance which corresponds to the width of the customer tray 34. However, as noted above, since dimensions of customer trays vary from IC manufacturer to manufacturer, the present catcher 52 is provided with a means for adjustment. The knob 96 mounted on the carriage 94 can be manually rotated in order to permit the removal of the arm/bridge combination. Thus, arm/bridge configurations with dimensions corresponding to other customer trays can be remounted on the catcher 52 for accurate handling of a wide variety of customer trays.

The movements of the catcher 52 are carefully controlled by means of the software operating on the CPU as directed by the operator and the control module. The handler 20 is at all times aware of the location and condition of the catcher 52 by means of various optical sensors, whose use and function are well known. For example, as shown in FIG. 8, the location of the catcher 52 in the right position can be detected by means of a sensor 114. Likewise, the left position and up and down positions of the catcher 52 can also be detected by similar sensors (not shown). The signals generated by the sensors are amplified by a sensor amplifier 115 (FIG. 6), whereupon the signals are transmitted to the control module.

Likewise, the presence of a customer tray 34 within the grasp of the arms 57a,b of the catcher 52 can be detected by a pair of sensors 116a,b located on the inner surfaces of the arms 57a,b (see FIG. 8).

Buffer

The buffer 54 component of the loader 50 of the present invention is located to the right of the catcher 52 as shown in FIGS. 1 and 5. The purpose of the buffer 54 is to receive a customer tray 34 from the catcher 52 and to hold it in a position proximate to the dual load stages 56a,b so that it can be quickly and efficiently loaded into one of the stages 56a,b by means of the transfer arm 40.

Thus, like the catcher 52, the buffer 54 translates laterally between a left position adjacent the catcher 52 and a right position adjacent load stage 56a, as best illustrated in FIG. 5. In addition, the buffer 54 is also capable of up and down movement, as will be described in more detail below.

Figures 9, 10:
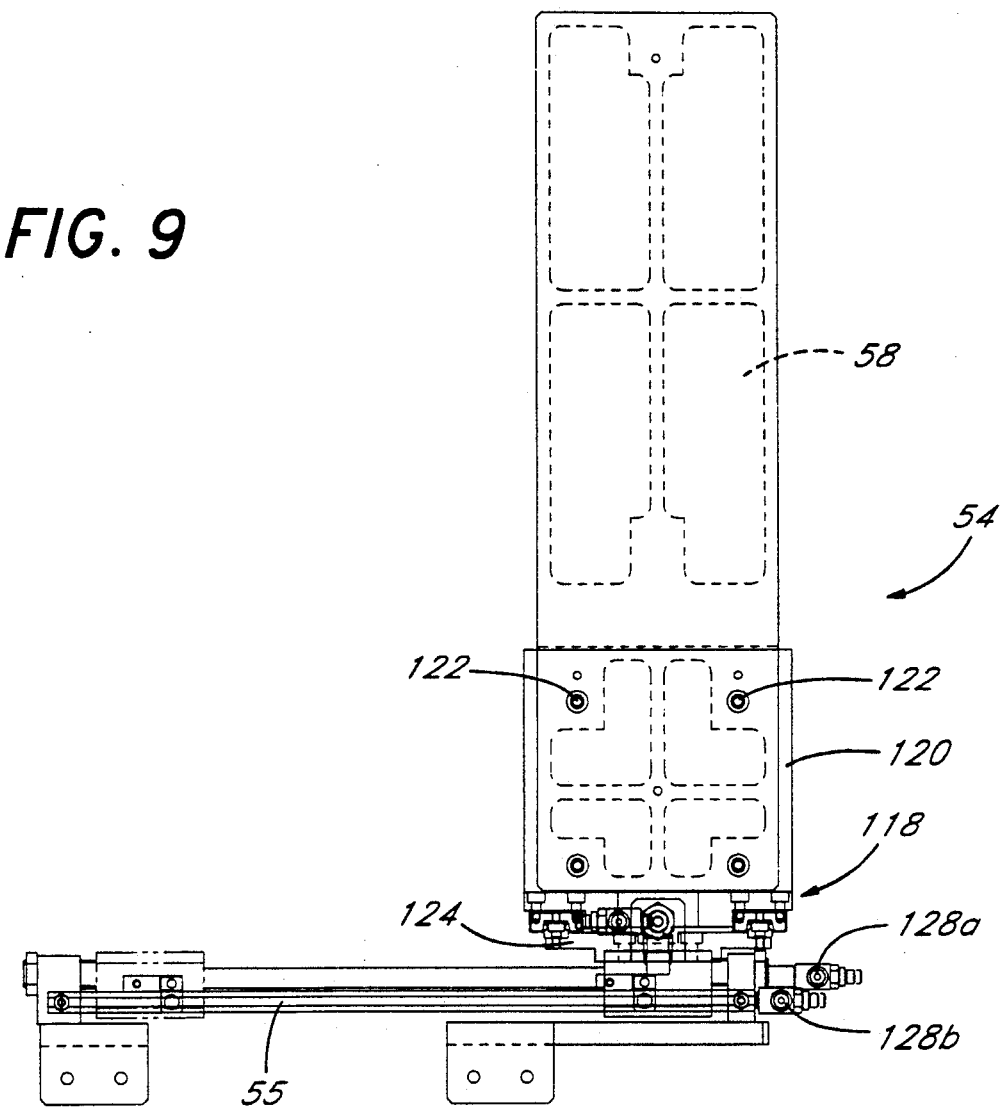
FIG. 9 is a top plan view of the buffer of the handler.
FIG. 10 is a front elevational view of the buffer.

Referring to FIGS. 9 and 10, the buffer 54 is shown in a top plan view in FIG. 9 and a rear elevational view in FIG. 10. FIG. 9 illustrates the buffer 54 in its right hand position adjacent the load stage 56a. The buffer 54 translates laterally on a series of horizontal guide rails 55 to a left position, but will not stop at any intermediate position. In the case of the buffer 54, the guide rails are located at the front of the handler 20 so as to be on the opposite side of the customer trays 34 as the guide rails for the catcher 52. This arrangement allows the catcher 52 and buffer 54 to overlap one another in their extreme right hand and left hand positions, respectively, as described in more detail below.

The buffer 54 is comprised of an L-shaped carriage 118 and a plate 58 for holding the customer trays 34 thereon. The plate 58 is mounted on the horizontal portion 120 of the carriage 118, as shown in FIG. 9, by means of four fasteners 122. Thus, the plate 58 can be removed and placed with plates of other dimensions in order to accommodate customer trays of different manufacturers.

The carriage 118 of the buffer 54 is mounted on a bracket 124 which moves vertically on a pair of guide rails 126, as shown in FIG. 10. The bracket is also mounted for horizontal movement on the above-described rails.

The buffer 54, like the catcher 52, is also actuated pneumatically in both the horizontal and vertical directions. Thus, the left and right movement of the buffer 54 is actuated by means of pneumatic valves 128a,b and the vertical movement of the buffer 54 is actuated by means of pneumatic valve 130a,b (see FIG. 10).

The position of the bracket is also detected by means of optical sensors. For example, the left position of the bracket is detected by means of a sensor 132, shown in FIG. 10. Similar sensors (not shown) also detect the right, up, and down positions of the buffer 54.

Load Stages

The stages of the loader 50 are illustrated in FIGS. 1 and 5 and are located to the right and in the same general horizontal plane as the buffer 54. A pair of load stages 56a,b are illustrated in side-by-side arrangement. The purpose of each load stage is to receive and hold a full customer tray 34 so that the ICs 36 contained thereon are accessible by the load pick and place 72 which transfers them to the test tray 48. If the customer tray 34 at load stage 56a becomes empty, the load pick and place 72 immediately begins to pick the ICs 36 from the customer tray 34 located at load stage 56b. This function can occur immediately without delay. While the load pick and place 72 is working at load stage 56b, the transfer arm 40 replaces the empty customer tray 34 at load stage 56a with a full tray. Thus, as soon as the customer tray 34 at load stage 56b is empty, the load pick and place 72 can continue its work at load stage 56a.

As illustrated in FIG. 5, each load stage comprises a plate 134 for receiving the customer tray 34. This plate does not move laterally, but is permitted only to move up and down along vertical rails 136a,b mounted at the front of the handler 20, as described in more detail below. Each load stage 56a,b is equipped with an adjustment mechanism 138, as shown in FIG. 5, which permits the stage to accommodate customer trays of different dimensions.

More details of each load stage 56a,b will be described in connection with the top plan view of FIG. 11 and the front elevational view of FIG. 12. Load stage 56a corresponds to the left portion of FIG. 11 while load stage 56b corresponds to the right portion thereof. For convenience, the customer tray plate in load stage 56b has been removed to simplify the following description. However, it will be noted that each load stage operates exactly alike, but independent of one another.

The customer tray plate 134 is removably mounted on an L-shaped bracket 140. The horizontal portion 142 of the bracket 140 is shown in FIG. 11 while the vertical portion 144 of the bracket 140 is shown in the right portion of FIG. 12. This bracket 140 is mounted for vertical movement up and down on a pair of vertical rails or guides 136a,b which are shown in the left portion of FIG. 12. The customer tray plate 134 of each load stage is actuated for vertical movement pneumatically by a pair of pneumatic valves 146a,b shown best in FIG. 12. The position of the plate 134 is detected by means of a sensor 148, also shown in FIG. 12.

Figure 11:
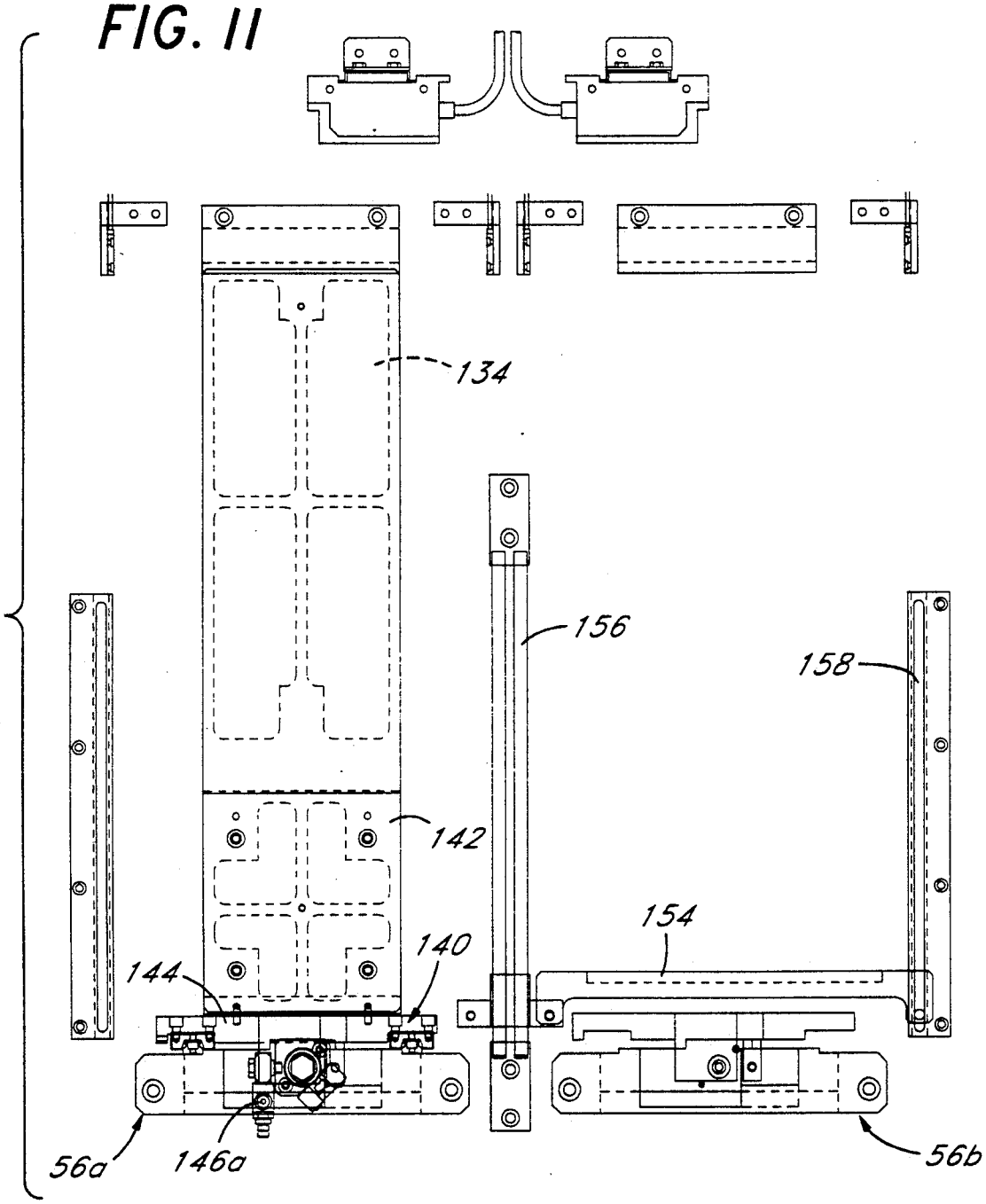
FIG. 11 is an exploded top plan view of the load/unload stages and tray stops.
Figure 12:
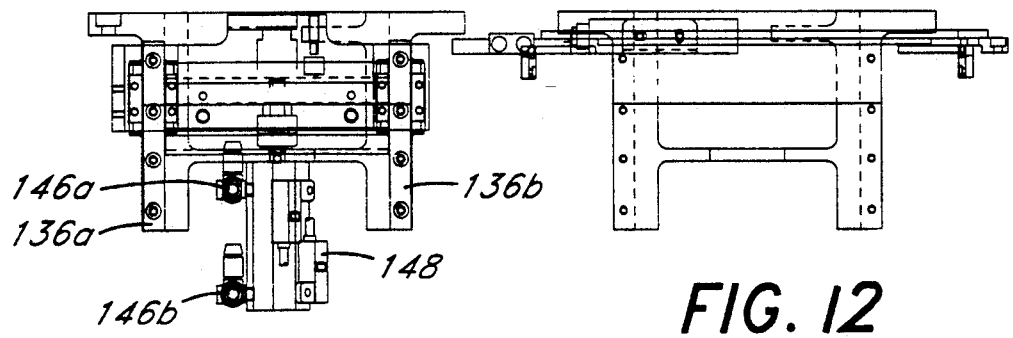
FIG. 12 is a front elevational view of the loader/unloader stages.

Moreover, the presence of a customer tray 34 on top of the plate 134 of the load stage 56 is detected by means of a pair of opposing sensors 150a,b arranged on either side of the plate 134, as shown in FIG. 11. The signals generated by the sensors 150a,b are amplified by a pair of amplifiers 152a,b as shown in FIG. 11.

Each load stage 56a,b is capable of adjustment by means of a cross bar 154 shown in FIG. 11. The cross bar 154 is mounted for horizontal movement along a left guide rail 156 and a right groove 158. The cross bar 154 can be slidably moved toward the rear end of the plate 134 in order to adjust the load stage 56 for various customer tray configurations.

Description of the Unloader

Referring to FIGS. 1 and 5, the unloader 60 of the present invention is comprised of two pair of unload stages 62a,b and 64a,b situated to the right of the loader 50. The unloader 60 also comprises an unload buffer 66 located at the extreme right hand portion of the handler 20 and adjacent unload stage 64b. As noted above, the purpose of the unloader 60 is to hold empty customer trays 34 in position adjacent the unload pick and place mechanisms so as to receive sorted ICs following testing. Like the load stages 56a,b, the unload stages 62, 64 are arranged in dual fashion so that when one customer tray 34 at one of the unload stages is full of sorted ICs, an unload pick and place 74, 76 can immediately begin to place ICs 36 into the customer tray 34 located at the adjacent load stage. While this is occurring, the transfer arm 40 can remove the full customer tray 34 and replace it with an empty tray so that sorting can continue immediately upon the filling of the adjacent customer tray 34. It will be noted that two pair of unload stages 62, 64 are provided as opposed to only a single pair of load stages 56a,b. This is due to the additional time required for sorting of the ICs 36. Other than this distinction, each unload stage 62, 64 is constructed and operates in a fashion identical to the load stages 56a,b described above in connection with the loader 50 of the present invention. Therefore, such description need not be repeated here. In addition, the unload buffer 66 also functions in a manner identical to the buffer 54 of the loader 50, with the exception that no horizontal movement is required.

The interaction of the unloader 60 with the loader 50 and transfer arm 40 will be described in more detail below.

Description of the Transfer Arm

As noted above, the transfer arm 40 of the present invention performs a vital function in transferring customer trays 34 between and among the various locations of the loader 50 and unloader 60. The transfer arm 40 also interacts with the customer tray magazines 32 located at the various stations of the magazine output area 30 below the loader 50 and unloader 60. The transfer arm 40 is directed in its movements by the control module, and the logic and sequence of its functions are dictated by control software running in the CPU of the handler 20.

As shown best in FIG. 4, the transfer arm 40 is comprised of a pair of customer tray receptacles 41a,b which are mounted for horizontal movement by means of a bracket 160 which runs along a guide rail 162. As explained in more detail below, the transfer arm 40 is also capable of up and down movement in order to interact with the customer tray magazines 32 located at the various stations of the magazine output area 30, as illustrated in FIG. 4. The customer tray receptacles 41a,b of the transfer arm 40 are arranged in a horizontal plane so as to be in line with the load and unload stages 56, 62, 64 above and the magazines 32 below. The interaction between the transfer arm 40 and the various components of the loader 50 and unloader 60 will be explained below in more detail in connection with FIG. 16.

The construction and operation of the transfer arm 40 can be described in more detail in connection with FIGS. 13-14. Referring first to FIG. 13, the two customer tray receptacles 41a,b of the transfer arm 40 are shown in side-by-side arrangement. Each receptacle is connected by a bridge 164 which is in turn mounted on the bracket 160 for horizontal translation along the guide rail 162. The transfer arm 40 is actuated horizontally by means of a linear stepper motor 166.

Each receptacle 41a,b of the transfer arm 40 is identical in construction and operation, but they function independently of one another. Each receptacle 41a,b is comprised of a pair of arms 42a,b for receiving a customer tray 34. The arms 42a,b are arranged in a horizontal fashion so as to engage the sides of the customer tray 34, which is shown in dotted lines in the right receptacle 41b of FIG. 13. The spacing between the two receptacles 41a,b is carefully gauged so as to position the transfer arm 40 directly in vertical alignment with two adjacent components of the loader 50 or unloader 60 as described below in more detail.

It will be noted that the receptacles 41a,b are cantilevered at their rear so as to extend forwardly toward the front of the handler 20. Thus, the mounting of the transfer arm 40 at the rear of the handler 20 is advantageous so as to avoid interference with the movement of customer trays 34 and in particular the movement of the load and unload stages and the buffers all of which are mounted for movement at the front of the handler 20.

The receptacle 41a engages the customer tray 34 by means of four pins 168, a pair of which are located on each arm 42a,b of the receptacle 41a and in opposing relation, as shown in FIG. 13. The pins 168 are actuated pneumatically so as to cause them to protrude to engage the customer tray 34 when a pair of sensors 170a,b, also located on the arms 42a,b, detects the presence of the tray.

FIG. 14 illustrates the manner in which each receptacle can be moved vertically. The arms 42a,b of each receptacle are mounted on a bracket 173 which moves on a pair of vertically arranged guide rails 172a,b. The bracket 173 is connected to a rod 174 which is mounted to a rotary pneumatic cylinder (not shown). The rotary pneumatic cylinder is actuated by valves 175a,b. Because of the narrow space provided for the mounting mechanism of the transfer arm 40, a rotary cylinder accomplishes movement of the receptacle 41 without occupying a large space. The rotational movement of the rod 174 causes a cam 176 to actuate a cam follower 177 mounted on the bracket 173, thus driving the bracket 173 of the receptacle 41a up and down. When the rod 174 is in its horizontal position, the receptacle 41a is down, when the rod 174 is rotated 900, this rotation is translated by the cam arrangement to a vertical stroke thus causing the receptacle 41a to assume its upper position. The location of the receptacle 41a vertically can be determined by means of a sensor 178 shown in FIG. 13. The receptacle 41a moves to its down position to access the tray magazines 32, as explained below.

Operation

The operation of the loader 50, unloader 60, and transfer arm 40 of the present invention can be best described in connection with FIGS. 15-16. In general, as an important advantage of the present invention, the physical arrangement of these various components minimizes the amount of movement of the transfer arm 40, thereby reducing customer tray 34 handling time. In addition, the interactive movements of these components are carefully coordinated, in order to avoid interference and again reduce test handling time.

Figure 15:
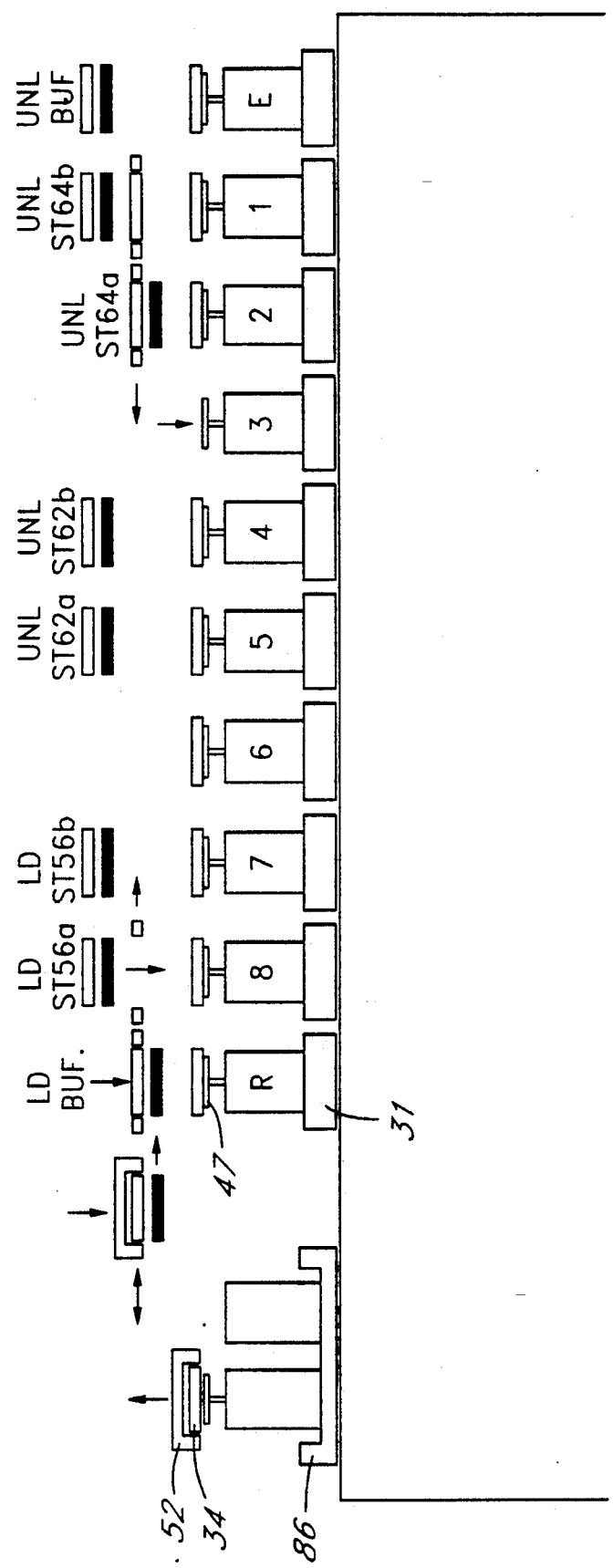
FIG. 15 is a schematic illustrating the spatial relationships existing between the various components of the loader/unloader

FIG. 15 illustrates the physical arrangement of the components of the loader 50 and unloader 60 with respect to the transfer arm 40 and the customer tray magazines 32. In this example, it will be noted that two load stages 56a,b and two pair of unload stages 62a,b and 64a,b are illustrated, along with corresponding load and unload buffers 54, 66. The transfer arm 40 is shown in two possible locations beneath these stages in order to simplify the description. In addition, a total of 10 magazine stations 31 are arranged beneath the stages, including test categories 1-8 (arranged from right to left so as to minimize sort time and travel distance of the transfer arm 40, it being recognized that category 1 typically has the larger quantity of ICs in it). In addition, a retest station is located at the far left of the magazine output area 30 and an empty station E is located at the far right. Each magazine 32 is shown with a customer tray 34 elevated slightly above by means of the elevator associated with each magazine 32. A customer tray 34 may be full or partially full depending upon the status of the sorting at the particular time shown in FIG. 15. However, it should be noted that various other configurations of load and unload stages, buffers and output magazines are possible and are within the scope of the present invention.

Thus, FIG. 15 illustrates the vertical alignment of these various components which minimizes transfer arm 40 travel time. For example, beginning at the left of FIG. 15, the right hand position of the buffer 54 is located directly above the retest magazine station R. Likewise, the left load stage 56a is located directly above the customer tray 34 found at magazine category 8, and so on. Therefore, the two receptacles 41a,b of the transfer arm 40 can be simultaneously vertically aligned, considering first the upper components, with the buffer 54 on the left and load stage 56a on the right, or, considering the lower components, with the retest magazine station R on the left and test category 8 on the right.

Accordingly, depending upon the customer tray handling sequence, the transfer arm 40 can service any of these four components during a single trip to this position at the left side of the handler 20 without requiring additional movement. Moreover, the transfer arm 40 is typically directed to service at least two of these components on the same trip at the same time. These functions are accomplished with only minimal horizontal movement of the transfer arm 40; although, the transfer arm 40 and the four above-described components do interact vertically, one with another. This coordinated movement is described below in more detail in connection with FIG. 16.

For example, on this trip shown on the left portion of FIG. 15, the transfer arm 40 could deposit one customer tray 34 engaged by its left receptacle 41a on the elevator 47 of magazine station retest R and deposit a second customer tray 34 engaged in its right receptacle 41b in the magazine station 8 corresponding to test category 8. On this same trip, and without additional movement of the transfer arm 40, the right receptacle of the transfer arm 40 could then remove an empty customer tray 34 from load stage 62a and then receive a full customer tray 34 from the buffer 54. At this point, by making a shift of a single position to the right, the transfer arm 40 could depart the full customer tray 34 just received from the buffer 54 and now engaged in its left receptacle in the load stage 56a in order to permit continued loading. Thus, a number of functions have been accomplished by the transfer arm 40 on a single trip with minimal transfer arm movement. The transfer arm 40 may then be directed to deposit the empty customer tray 34 in its right receptacle 41b at the empty tray magazine station E or at the unload buffer 66.

However, it should be noted that vertical movement of these components can be accomplished much more quickly and accurately than horizontal translation of the transfer arm 40.

Likewise, these advantages are also obtained in connection with the interaction between the transfer arm 40 and other components of the present invention. For example, still referring to FIG. 15, the transfer arm 40 is also shown schematically at the right portion thereof beneath unload stages 64a and 64b. In this case, the left receptacle 41a of the transfer arm 40 is aligned under unload stage 64a and the right receptacle under unload stage 64b. In this example, the unload stage 64a is shown in its lower position depositing a full or partially full customer tray 34 into the left receptacle of the transfer arm 40. As soon as this is accomplished, the transfer arm 40 shifts one position to the left in order to align the right receptacle 41b of the transfer arm 40 with unload stage 64a. The transfer arm 40 is then able to deposit the customer tray 34 in its right receptacle 41b onto unload stage 64a.

By way of example, this customer tray 34 may be empty in order to permit unload pick and place 76 to continue sorting tested ICs, or the customer tray 34 may be partially full and may represent a test category previously sorted in quantities insufficient to fill the customer tray. In either event, as soon as the customer tray 34 and right receptacle 41b is deposited on unload stage 64a, the transfer arm 40 can move on to another job. The unload stage 64a can then return to its upper position so that sorting can continue. In particular, the full or partially full customer tray 34 now in the left receptacle 41a may need to be returned to the appropriate magazine station 31. By way of example, if this were category 3, the left receptacle 41a would automatically be vertically aligned with this station 31 since the right receptacle 41b was most recently realigned with unload stage 64a. Therefore, in order to accomplish this job, the left receptacle 41a of the transfer arm 40 need only drop to its lower position to deposit the customer tray 34 on the elevator 47 at magazine station 3. This movement of the left receptacle 41a is shown schematically by the arrows of FIG. 15.

Thus, it can be seen that the transfer arm 40 can accomplish a number of functions quickly and efficiently due to the vertical alignment of the various components of the loader and unloader of the present invention, arranged in vertical cooperation with the various stations of the magazine output area 30.

Furthermore, the movements of the components of the present invention are carefully coordinated so as to minimize handling time. This important feature of the present invention is illustrated in connection with FIG. 16, and more particularly the schematic illustrations of FIGS. 16a-16g. This series of drawings illustrate a typical customer tray handling sequence accomplished by the transfer arm 40 in cooperation with several unload stages as well as the customer tray magazines 32. However, it should be noted that these views are illustrative only of the capabilities of the present invention and the principles thereof are equally applicable to a wide variety of loader and unloader configurations and handling sequences.

Figure 16A:
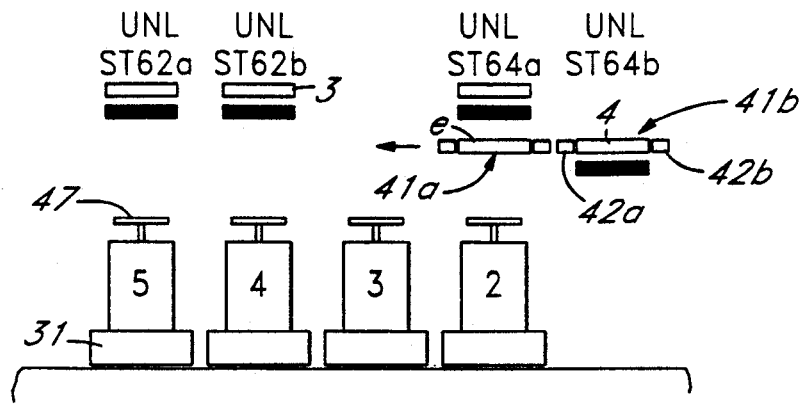
FIGS. 16a–16g are a sequence of schematic views of the movement of the components of the loader/unloader.

Referring first to FIG. 16a, there is defined a horizontal lane for principal travel of the transfer arm 40 between the unload stages located above and the customer tray magazines located below. The transfer arm 40 is actuated along this horizontal lane of travel by means of the linear stepper motor 166 and the guide rail 162 as illustrated clearly in FIG. 13. The purpose of this lane is to allow the transfer arm 40 to move quickly in its left and right movements in order to minimize handing time. Because of the possibly large number of IC sort categories, this horizontal movement of the transfer arm 40 can incur a significant amount of handling time.

Therefore, it is an important feature of the present invention to minimize this time by providing a clear path or lane for the transfer arm 40 to move quickly from side to side. At the same time, much of the transfer of customer trays to and from the transfer arm 40 is accomplished vertically through much shorter distances. For example, the vertical travel distance of one of the receptacles 41a,b of transfer arm 40 as it deposits a customer tray 34 onto the magazine elevator 47 is, in one example, only about 30 millimeters. This vertical stroke is accomplished by means of the pneumatic rotary cylinder as described above in connection with FIG. 14. Thus, the vertical movements in the present handler 20 are kept very short and tight in order to minimize handling time. This vertical transfer to and from the receptacles 41a,b of the transfer arm 40 is accomplished in part due to the cantilevered and side clamping movement of the receptacles 41a,b, as explained above in more detail in connection with FIG. 13. In other words, customer trays 34 can be received into either receptacle 41a,b either from the top or from the bottom because of the open configuration of the arms 42a,b of each receptacle.

Therefore, in order to accomplish these advantages of the present invention, there is components of the loader and unloader must cooperate with the transfer arm 40 in an accurate and efficient manner. This can be illustrated with the example of FIGS. 16A–16G. In this example, it will be presumed that the transfer arm 40 is to the right aligned with magazine stations 1 and 2 as partially shown in FIG. 16A. In the left receptacle 41a of the transfer arm 40 is found an empty customer tray as designed by the letter "e." In the right receptacle 41b of the transfer arm 40 is found a customer tray, designated by the numeral "4", having ICs falling into test category 4. This customer tray was just received into the right receptacle 41b from unload stage 62b, either because the customer tray is full or sorting for that IC category has been completed.

Therefore, the transfer arm 40 is directed by the control module to deposit the category 4 customer tray on the station 4 of customer tray magazine. In order to accomplish this, a transfer arm 40 begins a trip to the left as indicated by the arrow in FIG. 16A.

Figure 16B:
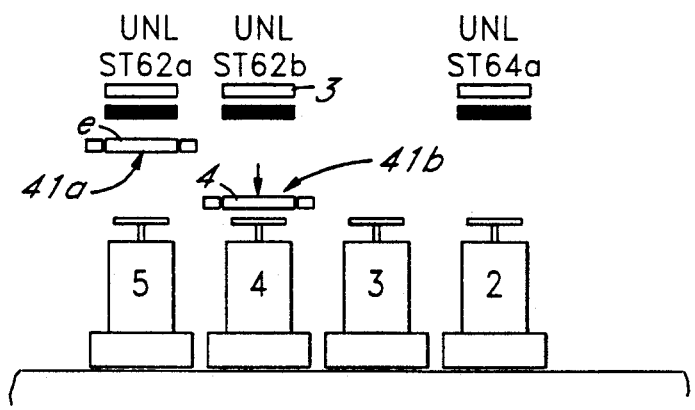
Figure 16C:
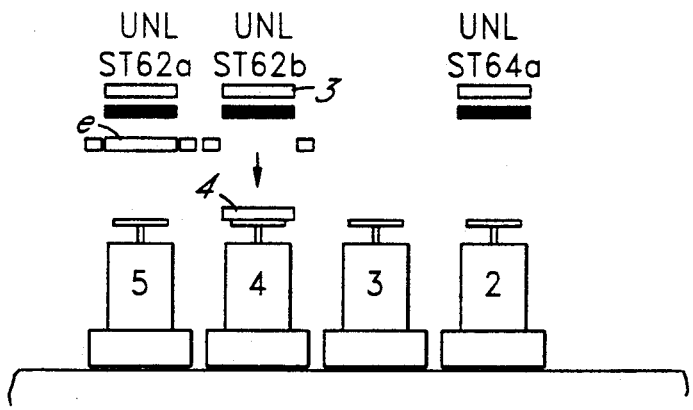
Figure 16D:
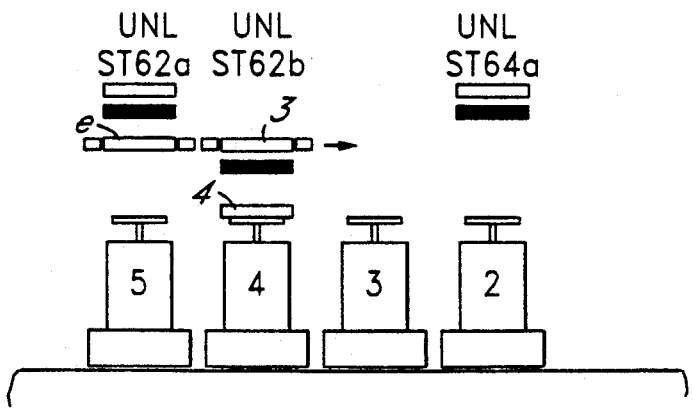

Referring to FIG. 16B, a transfer arm 40 moves far enough left so as to be aligned with magazine stations 5 and 4 with the right receptacle 41b aligned appropriately over magazine station 4. The right receptacle 41b then drops to its lower position in order to gently deposit the customer tray onto the tray elevator of station 4, as shown in FIG. 16B. At about this time, or possibly prior thereto, the control module is alerted that the customer tray 34 at unload stage 62b, which corresponds to sort category 3, is full and needs to be replaced with an empty customer tray. Accordingly, without any additional movement of the transfer arm 40, the unload stage 62b drops to its lower position as shown in FIG. 16D so that the category 3 customer tray can be engaged in the right receptacle 41b of the transfer arm 40. The transfer arm 40 then shifts one position to the right so that the right receptacle 41b is aligned over the category 3 magazine station as shown in FIG. 16E.

Figure 16E:
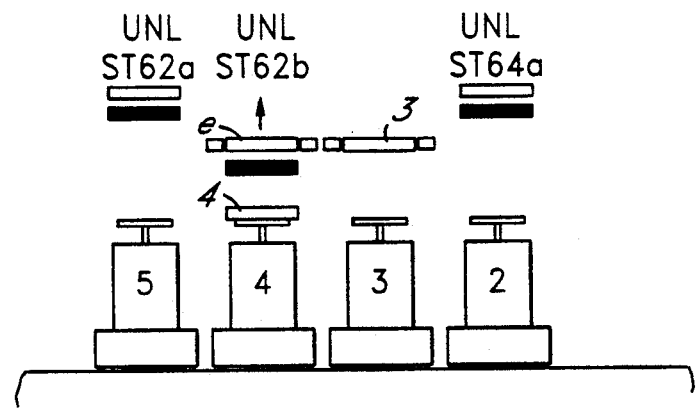
Figure 16F:
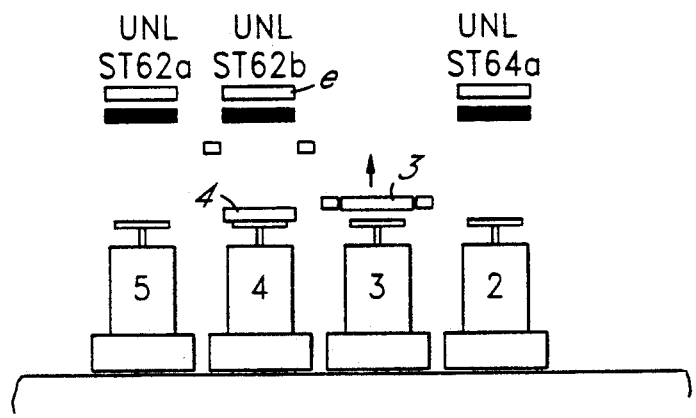
Figure 16G:
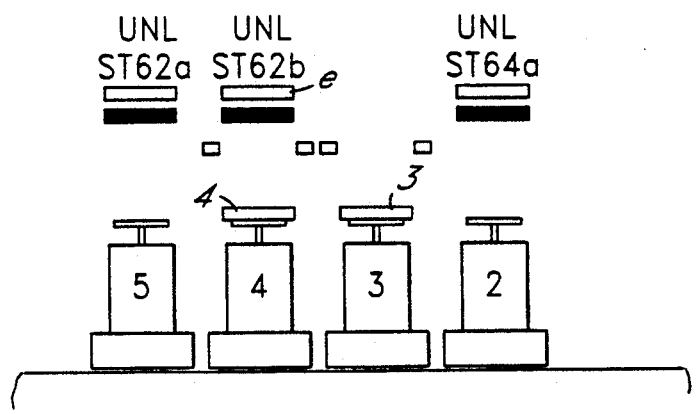

In this position, with unload stage 62b still in the down location, the left receptacle 41a of the transfer arm 40 can release the empty customer tray onto the unload stage 62b as shown in FIG. 16E. Unload stage 62b then rises to its upper position to permit continued sorting of tested ICs. At the same time the right receptacle 41b of the transfer arm 40 can drop to its lower position in order to deposit category 3 customer tray onto the elevator 47 of the station 3 magazine. These positions are shown in FIG. 16F. Finally, the right receptacle 41b of the transfer arm 40 rises again to its upper position, as shown in FIG. 16G, and is ready for another command. Accordingly, it can be seen that the loader and unloader mechanisms of the present invention can accomplish numerous functions with relatively little handling movement. As shown in the example of FIG. 16, several functions were accomplished by the various components described on a single trip by the transfer arm 40 involving only one shift in position.

In conclusion, it can be seen that the loader and unloader of the present invention represent a substantial advance in the IC test handler industry.

What is claimed is:

1. An apparatus for handling trays of an automatic test handler for testing integrated circuits ("ICs"), comprising:
   a plurality of customer trays for carrying said ICs to be tested before the testing and for carrying said ICs that have been tested ("tested ICs") after the testing;
   a plurality of test trays for receiving said ICs to be tested from said customer trays and for carrying said ICs to a test position of the automatic test handler;
   a loader magazine for receiving said plurality of customer trays having said ICs to be tested;
   an unloader magazine for receiving said plurality of customer trays having said tested ICs;
   a loader for loading said customer trays to a position for transferring said ICs to be tested to said test trays, said loader comprising:
      a tray catcher for receiving the customer trays from said loader magazines in an elevated position above said loader magazine;
      a buffer adjacent said tray catcher for temporarily receiving said customer trays;
      a load stage arranged at said position which is adjacent said buffer for receiving the customer trays from said buffer;
   an unloader for transferring said customer trays having said tested ICs from said test trays classified based on the test results into said unloader magazines, said unloader comprises a pair of unload stages for receiving said customer trays so that customer trays receive said tested ICs; and
   a transfer arm for (i) transferring said customer trays on said buffer to said load stage, and (ii) transferring said customer trays on said unload stages having tested ICs to said unloader magazines based on the test results.

2. A method for handling a plurality of trays of an automatic test handler for testing integrated circuits ("ICs"), said method comprising the following steps of:
   arranging a plurality of customer trays for carrying ICs to be tested in a loader magazine;
   arranging a plurality of test trays for receiving said ICs to be tested from said customer trays and carrying said ICs to a test position of the automatic test handler;
   receiving said customer trays from said loader magazine in an elevated position above said loader magazine;
   placing said customer trays temporarily on a buffer;
   transferring said customer trays on said buffer to a load stage adjacent said buffer;
   providing emptied customer trays to a pair of unload stages for receiving said ICs which have been tested from said test trays based on the test results; and
   transferring said customer trays on said unload stages to an unloader magazine based on the test results.

3. An apparatus as defined in claim 1, wherein said tray catcher is positioned over said loader magazine, said customer trays are lifted in said loader magazine by an elevator provided in said loader magazine so that said tray catcher takes the upper most customer tray in said loader magazine.

4. An apparatus as defined in claim 1, wherein said tray catcher comprises a pair of arms for carrying said customer trays and a plurality of pins horizontally movable from said arms for supporting said customer trays thereon.

5. An apparatus as defined in claim 3, wherein said tray catcher straddles said upper most customer tray from above with said arms and engages said customer tray from the sides with said pins underneath said customer tray and releases said customer tray on said buffer by withdrawing said pins.

6. An apparatus as defined in claim 4, wherein said pins in said tray catcher protrude and withdraw by pneumatic force generated by compressed air.

7. An apparatus as defined in claim 1, wherein said buffer comprises a plate for receiving said customer trays and a drive mechanism for driving said buffer in vertical and horizontal directions.

8. An apparatus as defined in claim 7, wherein said buffer assumes two positions, a first position vertically aligned with said catcher and a second position adjacent said load stage.

9. An apparatus as defined in claim 1, wherein said load stage comprises a plurality of load stages arranged in side by side fashion.

10. An apparatus as defined in claim 1, wherein said unloader comprises a plurality of pairs of unload stages for positioning emptied customer trays transferred from said load stage in said loader through said transfer arm.

11. An apparatus as defined in claim 10, wherein said unloader interacts with a pick and place mechanism which picks said tested ICs and places said tested ICs into said emptied customer trays for classifying said ICs in accordance with the test results.

12. An apparatus as defined in claim 11, wherein said each pair of unload stages receives a proportional amount of tested ICs to the other pair of unload stages.

13. An apparatus as defined in claim 1, wherein said unloader further includes an empty tray buffer for temporary receiving said customer trays which have been emptied in said loader and for providing said emptied customer trays to said unload stages for receiving said tested ICs.

14. An apparatus as defined in claim 11, wherein said unloader and said pick and place mechanism interact so that the classification of said tested ICs for a category having a small number of said tested ICs precedes the other category having a large number of said tested ICs.

15. An apparatus as defined in claim 1, wherein said transfer arm further transfers said customer trays which have been emptied in said loader to said unloader for receiving the tested ICs on said emptied customer trays.

16. An apparatus as defined in claim 1, wherein said transfer arm comprises a plurality of receptacles, each receptacle capable of receiving said customer trays, said receptacles being actuated independently of one another.

17. An apparatus as defined in claim 16, wherein said transfer arm further includes a plurality of pins horizontally movable on said receptables.

18. An apparatus as defined in claim 17, wherein said transfer arm accesses said customer trays either from the top or from the bottom of said customer trays, said receptacle engaging the sides of said customer trays by extending said pins under said customer trays.

19. A method for loading and unloading as defined in claim 2, wherein said method further includes a step of classifying the tested ICs into said emptied customer trays by a pick and place mechanism in said automatic test handler.

20. A method for loading and unloading as defined in claim 19, wherein said classification step is performed so that said classification for a category having a small number of said tested ICs has a priority to the classification for the other category having a large number of said tested ICs.

21. An apparatus for handling trays of an automatic test handler for testing integrated circuits ("ICs"), comprising:
   a plurality of customer trays for carrying ICs to be tested and for carrying said ICs after they have been tested;
   a plurality of test trays for receiving said ICs to be tested from said customer trays and for carrying said ICs to a test head of the automatic test handler;
   a loader magazine for receiving said plurality of customer trays carrying said ICs to be tested;
   an unloader magazine for receiving said plurality of customer trays carrying said tested ICs;
   a loader for loading said customer trays so that said ICs to be tested are transferred to said test trays, said loader comprising a load stage for receiving said customer trays from said unloader magazine;
   an unloader for transferring said customer trays having said tested ICs from said test trays classified on the basis of test results into said unloader magazines, said unloader comprising an unload stage for receiving said customer trays which are emptied at said load stage so that said customer trays receive said tested ICs; and
   a transfer arm for transferring said customer trays from said unloader magazine to said load stage, and transferring empty customer trays from said load stage to said unload stages.

22. The apparatus of claim 21, wherein said loader further comprises a buffer positioned between said unloader magazine and said load stage.

* * * * *